(12) United States Patent
Murase

(10) Patent No.: US 7,223,316 B2
(45) Date of Patent: May 29, 2007

(54) METHOD FOR MANUFACTURING ELECTRONIC COMPONENT

(75) Inventor: Tomohiko Murase, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 492 days.

(21) Appl. No.: 10/755,313

(22) Filed: Jan. 13, 2004

(65) Prior Publication Data

US 2004/0159396 A1     Aug. 19, 2004

(30) Foreign Application Priority Data

Feb. 18, 2003     (JP) .............................. 2003-040334

(51) Int. Cl.
  *B29C 65/00*     (2006.01)
  *B32B 37/00*     (2006.01)
  *H05K 3/00*      (2006.01)
(52) U.S. Cl. .......................... 156/293; 29/835; 29/837; 29/852; 101/127
(58) Field of Classification Search ................ 101/127; 29/837, 835
  See application file for complete search history.

(56) References Cited

U.S. PATENT DOCUMENTS

| | | | |
|---|---|---|---|
| 5,129,573 A | 7/1992 | Duffey | |
| 6,012,231 A | 1/2000 | Regner et al. | |
| 6,079,099 A | * | 6/2000 | Uchida et al. ................ 29/837 |

FOREIGN PATENT DOCUMENTS

| | | |
|---|---|---|
| DE | 195 43 021 A1 | 5/1996 |
| DE | 195 11 226 A1 | 10/1996 |
| JP | 06-305272 | 11/1994 |
| JP | 08-250855 | 9/1996 |
| JP | 10-013078 | 1/1998 |
| JP | 2001-196733 | 7/2001 |

OTHER PUBLICATIONS

Official Communication, including English translation; German Application No. 10 2004 005 685.4-34; Jul. 4, 2005.
Official communication issued in the corresponding German Application No. 10 2004 005 685.4-34, mailed on Jan. 19, 2007.

* cited by examiner

*Primary Examiner*—Justin R. Fischer
(74) *Attorney, Agent, or Firm*—Keating & Bennett, LLP

(57) ABSTRACT

A method for manufacturing an electronic component includes the steps of inserting tabs of a cover into through holes formed in a circuit board having mounting elements on the front surface thereof, disposing a print mask having openings at positions corresponding to the through holes on the back surface of the circuit board, and supplying solder cream to the through holes through the openings by placing the solder cream on the print mask and moving the solder cream in a predetermined direction with a squeegee. The print mask is provided with projections which project upstream in the moving direction of the solder cream in openings of the print mask, and the openings are shifted upstream in the moving direction of the solder cream. In addition, the tabs are inserted into the through holes such that the width direction of the tabs is along the moving direction of the solder cream.

13 Claims, 17 Drawing Sheets

MOVING DIRECTION

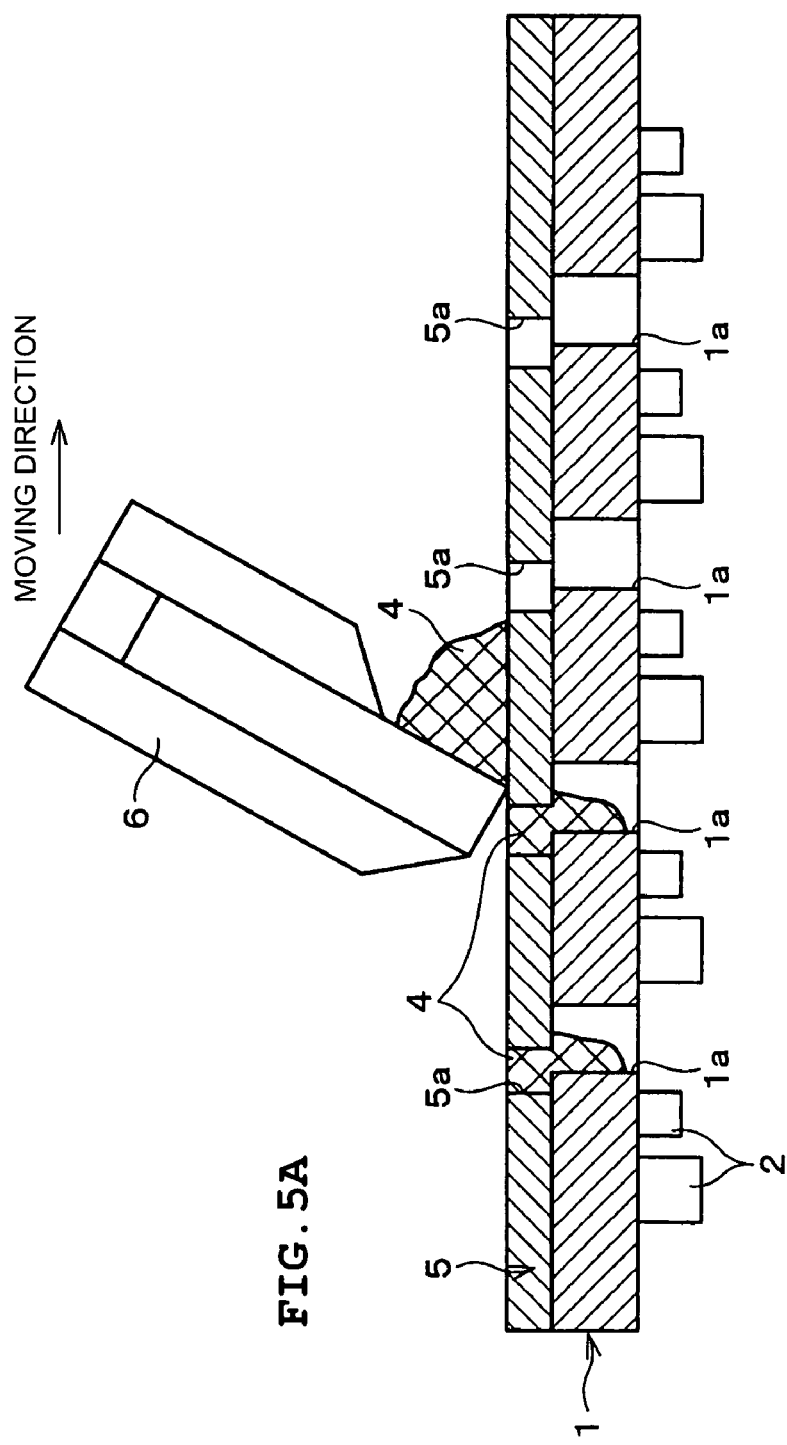
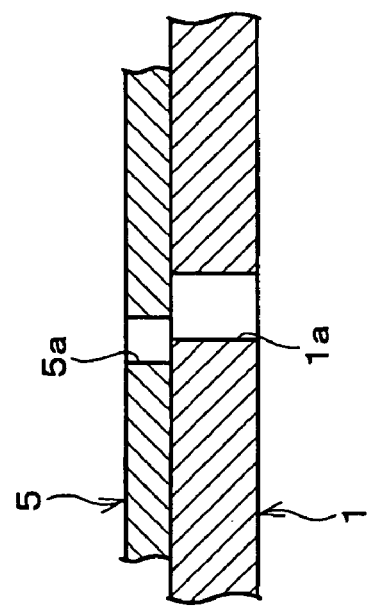

MOVING DIRECTION

MOVING DIRECTION

MOVING DIRECTION

MOVING DIRECTION

FIG.15A
PRIOR ART
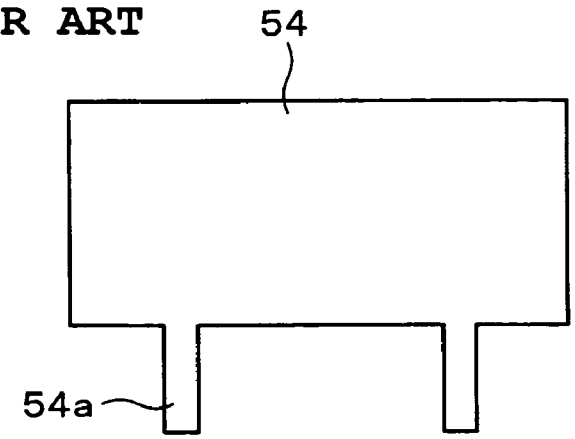
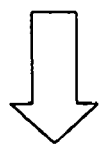
FIG.15B
PRIOR ART
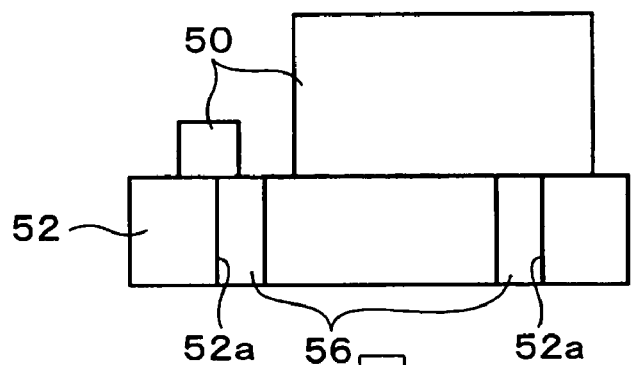
FIG.15C
PRIOR ART
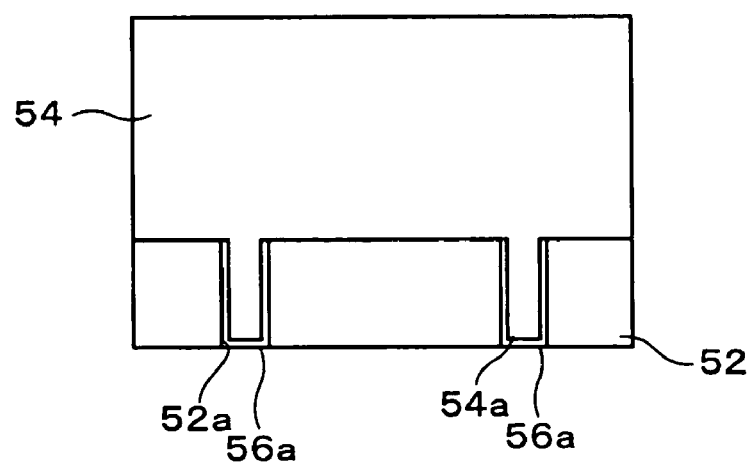

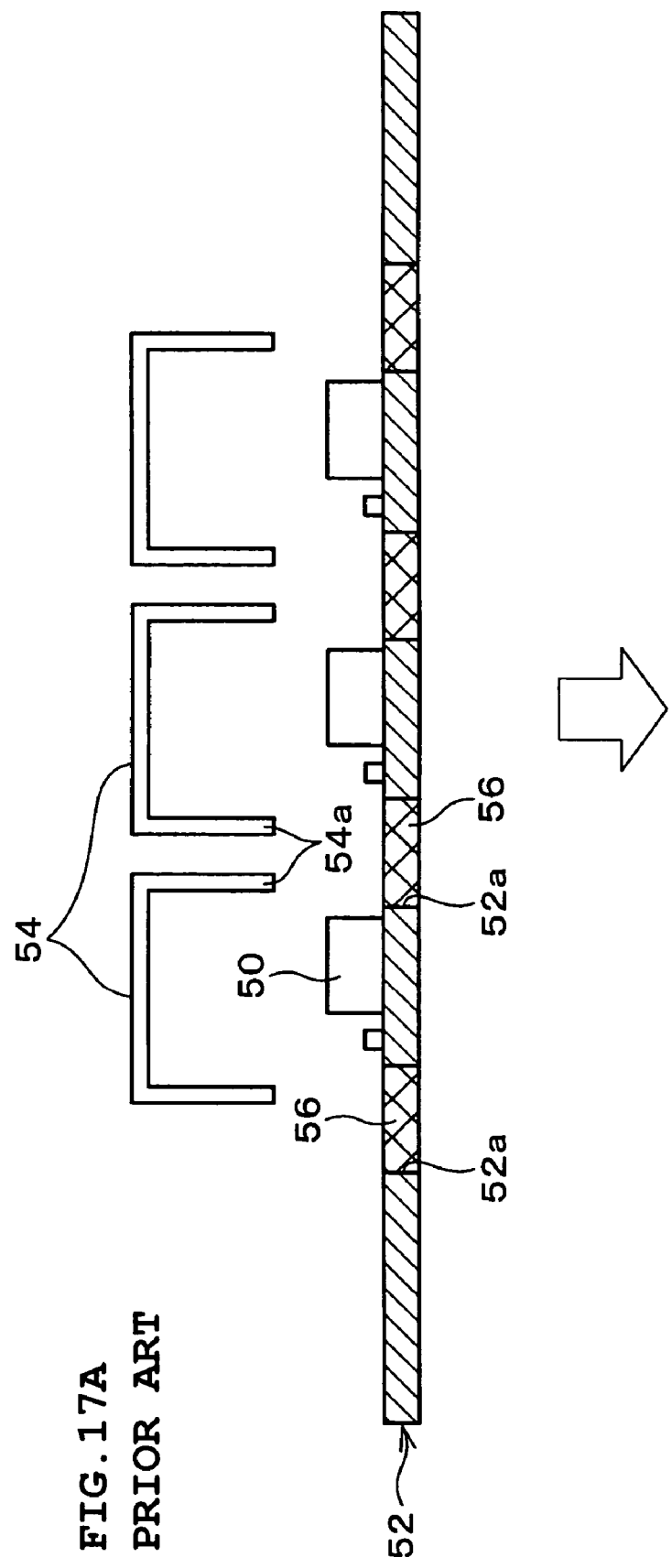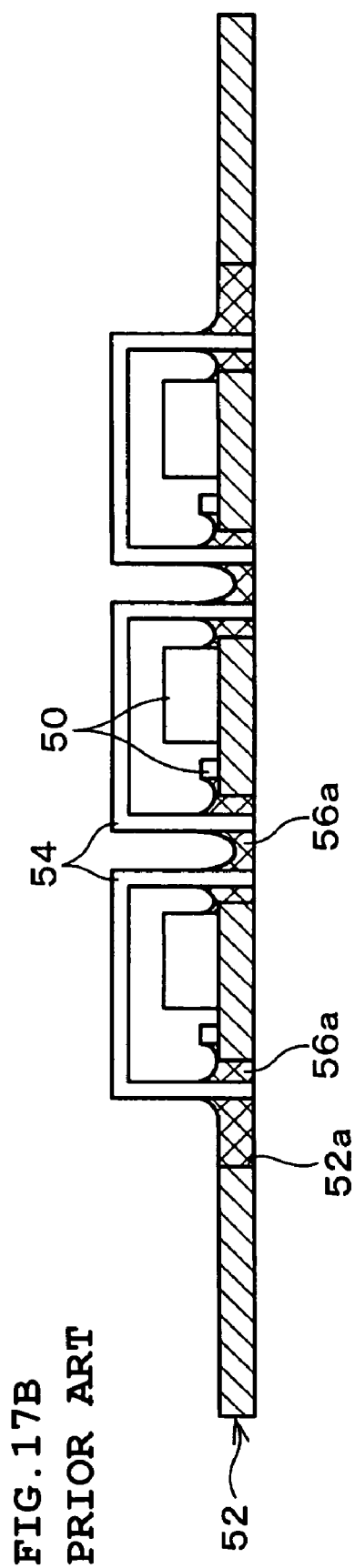

METHOD FOR MANUFACTURING ELECTRONIC COMPONENT

BACKGROUND OF THE INVENTION

1. Field of the Invention

The present invention relates to a method for manufacturing a module type electronic component which can increase the adhesion strength of a cover attached to the electronic component and minimize variations in the adhesion strength.

2. Description of the Related Art

Recently, radio communication devices such as mobile phones have become popular, and module type electronic components like the one shown in FIGS. 15A to 15C have been commonly used to reduce the size, weight, and cost of the radio communication devices and to ensure their resistance to change over time and functional stability. The electronic component shown in FIGS. 15A to 15C includes a circuit board 52 on which mounting elements 50 such as IC chips, capacitors, resistances, and coils are surface-mounted and a metal cover 54 which is attached to the circuit board 52 such that the mounting elements 50 are covered with the metal cover 54.

A method for manufacturing the above-described electronic component will be described below. First, as shown in FIG. 15B, through holes 52a which are formed in the rectangular plate-shaped circuit board 52 such that they extend through the thickness of the circuit board 52 at the periphery thereof are filled with solder cream 56. In addition, as shown in FIG. 15A, tabs 54a are provided on the open side of the box-shaped metal cover 54 at positions corresponding to the through holes 52a. Then, as shown in FIG. 15C, the tabs 54a are inserted into their respective through holes 52a so that the mounting parts 50 are covered with the metal cover 54. Then, the solder cream 56 disposed in the through holes 52a is melted by heating and solidified so that a solder member 56a is obtained. Accordingly, the metal cover 54 is attached to the circuit board 52 and the manufacturing process of the electronic component is completed.

With reference to FIG. 16, in order to fill the through holes 52a with the solder cream 56 in the above-described manufacturing method, a print mask 58 is disposed on the front surface of the circuit board 52 and the solder cream 56 is supplied to the through holes 52a through openings 58a formed in the print mask 58 by printing using a squeegee 60.

In this method, recesses 58b for receiving the mounting elements 50 must be formed in the print mask 58 so that the mounting elements 50 placed on the front surface of the circuit board 52 can be prevented from being damaged. Therefore, the thickness of the print mask 58 increases by the amount corresponding to the heights of the mounting elements 50, and the dimension of the openings 58a along the thickness of the print mask 58 increases accordingly. As a result, a large amount of solder cream 56 is used and costs are increased.

In order to overcome the above-described disadvantage, according to Japanese Patent No. 2850860 (disclosed on Jan. 16, 1998), a print mask is disposed on the back surface of a circuit board having mounting elements on the front surface thereof, and solder cream is supplied to the through holes through the print mask by printing. Then, tabs of a cover are inserted into the through holes and are attached to the through holes with solder. Accordingly, the thickness of the print mask can be reduced.

In FIG. 16, in order to increase the productivity (to reduce costs) of the electronic component, a large wafer including a plurality of circuit boards 52 is used. The metal cover 54 is attached to each of the circuit boards 52, as shown in FIG. 17A, and then a plurality of electronic components are manufactured by separating the circuit boards 52 from each other along cutting lines (imaginary lines) which pass through the through holes 52a by, for example, dicing.

Other examples of known methods are disclosed in, for example, Japanese Unexamined Patent Application Publications No. 6-305272, No. 8-250855, and No. 2001-196733.

According to the above-described known method, when the solder cream 56 is supplied to the through holes 52a as shown in FIG. 17A, and is melted and solidified so as to obtain the solder member 56a and achieve adhesion as shown in FIG. 17B, excess solder 56a may come into contact with terminals of the mounting elements 50 placed on the circuit board 52. In such a case, the electrical characteristics of the mounting elements 50 are degraded due to short circuit or other defects and malfunction occurs in the mounting elements 50. Therefore, the yield of the electronic component is reduced.

More specifically, in the above-described known method, a single through hole 52a receives two tabs 54a, one belonging to each of the adjacent metal covers 54, and the size of each through hole 52a is large since a predetermined interval must be provided between the adjacent metal covers 54 in order to attach them. Accordingly, a large amount of solder cream 56 is used for filling each of the through holes 52a.

When such a large amount of solder cream 56 is melted for adhesion, excess molten solder cream 56 comes into contact with the terminals of the mounting elements 50 placed on the circuit board 52, as shown in FIG. 17B. Then, when the solder member 56a is obtained by solidifying the solder cream 56, the mounting elements 50 are electrically connected to the metal covers 54, which are normally short-circuited (grounded). Therefore, malfunction due to short-circuit occurs and the yield of the electronic component is reduced.

SUMMARY OF THE INVENTION

In order the solve the problems described above, preferred embodiments of the present invention provide a method for manufacturing an electronic component in which the amount of solder supplied to the through holes can be adjusted so that the metal cover can be reliably fixed to the circuit board with exactly a required amount of solder without using excessive solder, and which can thereby increase the yield of the electronic component.

According to a preferred embodiment of the present invention, a method for manufacturing an electronic component includes the steps of forming through holes in a circuit board having mounting elements on the front surface of the circuit board, inserting tabs of a cover into the through holes, disposing a mask on the back surface of the circuit board, the mask having openings for supplying a fluid adhesive to the through holes by printing at positions corresponding to the through holes, supplying the adhesive to the through holes by placing the adhesive on the mask and moving the adhesive in a predetermined direction with a squeegee, and solidifying the adhesive to fix the cover to the circuit board. The mask is provided with projections in the openings thereof, the projections projecting upstream in the moving direction in which the squeegee moves the adhesive, and the openings of the mask are shifted upstream in the moving direction in which the squeegee moves the adhesive so that the through holes are partially covered with the mask. In addition, the tabs of the cover are inserted into the through holes such that the width direction of the tabs is along the moving direction in which the squeegee moves the adhesive.

According to the above-described method, since the fluid adhesive is supplied to the through holes from the back surface of the circuit board by printing using the mask, the thickness of the mask and the amount of adhesive placed in the openings of the mask can be reduced. Accordingly, costs can be reduced.

In addition, in the above-described method, the mask is provided with the projections which project upstream in the moving direction in which the squeegee moves the adhesive in the openings of the mask, and the openings of the mask are shifted upstream in the moving direction in which the squeegee moves the adhesive. Therefore, the amount of adhesive supplied to the through holes can be adjusted by adjusting the overlapping area between the openings and their respective through holes, and the use of excessive adhesive can be prevented. Thus, according to the above-described method, the adhesive can be prevented from coming into contact with the mounting elements placed on the front surface of the circuit board and degradation in the electrical characteristics due to short circuit or other defects caused when the adhesive comes into contact with the mounting elements can be prevented.

In addition, in the above-described method, the tabs of the cover are inserted into the through holes such that the width direction of the tabs is along the moving direction in which the squeegee moves the adhesive. Accordingly, the adhesive can be efficiently supplied to the gaps between the inner surfaces of the through holes and the tabs of the cover due to the projections in the openings of the mask which project upstream in the moving direction in which the adhesive is moved.

Therefore, according to the above-described method, even when the amount of adhesive supplied to the through holes is reduced due to the openings and the projections, the adhesive can be supplied sufficiently enough to attach the tabs of the cover to the inner surfaces of the through holes by suitably arranging the openings, the projections, and the tabs. Accordingly, degradation in the electrical characteristics caused when the adhesive comes into contact with the mounting elements can be prevented. In addition, the adhesion strength can be increased and variations in the state of adhesion can be reduced. As a result, the yield of the electronic component can be increased.

In the above-described method, end portions of the projections are preferably positioned on imaginary lines which pass through the centers of the through holes along the moving direction in which the squeegee moves the adhesive.

When the end portions of the projections are positioned on the imaginary lines which pass through the centers of the through holes along the moving direction in which the squeegee moves the adhesive, even when a plurality of (for example, two) tabs are inserted into a single through hole, the adhesive can be more efficiently supplied to the gaps between the inner surfaces of the through holes and the tabs. Accordingly, degradation in the electrical characteristics caused when the adhesive comes into contact with the mounting elements can be prevented. In addition, the adhesion strength can be increased and variations in the state of adhesion can be reduced. As a result, the yield of the electronic component can be increased.

In the above-described method for manufacturing the electronic component, the end portions of the projections are preferably positioned on the imaginary lines which pass through the centers of the through holes along the moving direction in which the squeegee moves the adhesive, and each of the projections may be formed such that it is symmetric with respect to the corresponding imaginary line.

When each of the projections is symmetric with respect to the corresponding imaginary line, even when a plurality of (for example, two) tabs are inserted into a single through hole, the adhesive can be more efficiently supplied to the gaps between the inner surfaces of the through holes and the tabs.

In the above-described method for manufacturing the electronic component, the shape of the projections may be similar to that of the through holes. When the shape of the projections is similar to that of the through holes, the overlapping area between the openings and their respective through holes is reliably made equal on both sides of the projections with respect to the moving direction in which the adhesive is moved. Accordingly, even when a plurality of (for example, two) tabs are inserted into a single through hole, the adhesive can be more efficiently supplied to the gaps between the inner surfaces of the through holes and the tabs due to the projections.

In the above-described method for manufacturing the electronic component, the adhesive may be a solder material. When the adhesive is a solder material, the cover can be attached to the circuit board such that they are electrically connected to each other. Accordingly, when the cover has a function to block the electromagnetic waves, the cover can be easily used as a shield case.

As described above, in the method for manufacturing the electronic component according to various preferred embodiments of the present invention, the tabs of the cover are inserted into the through holes formed in the circuit board having the mounting elements on the front surface thereof, and the mask having the openings for supplying the adhesive to the through holes by printing is disposed on the back surface of the circuit board. The mask is provided with the projections which project upstream in the moving direction in which the squeegee moves the adhesive in the openings of the mask, and the openings of the mask are shifted upstream in the moving direction. In addition, the tabs of the cover are inserted into the through holes such that the width direction of the tabs is along the moving direction.

Therefore, according to the above-described method, adhesion strength is greatly increased and variation in the adhesion strength is significantly reduced. Accordingly, the cover can be reliably fixed to the through holes by adhesion. In addition, the use of excessive adhesive can be prevented and degradation in the electrical characteristics of the mounting elements due to the excess adhesive does not occur. Accordingly, the yield of the electronic component can be increased.

Other features, elements, characteristics, steps, and advantages of the present invention will become more apparent from the following detailed description of preferred embodiments of the present invention with reference to the attached drawings.

BRIEF DESCRIPTION OF THE DRAWINGS

FIGS. 5A and 5B are sectional views showing the steps of the method for manufacturing the electronic component according to a preferred embodiment of the present invention, where FIG. 5A is a sectional view showing a step of printing solder cream after the print mask is attached and FIG. 5B is a sectional view showing a state after the print mask is attached and before the solder cream is printed;

FIG. 11A is a plan view showing the step of printing the solder cream using the print mask and FIG. 11B is a plan view showing the distribution of solder obtained by melting and solidifying the solder cream;

FIG. 12A is a plan view showing a step of printing the solder cream and FIG. 12B is a plan view showing the state of solder obtained by melting and solidifying the solder cream;

FIGS. 15A to 15C are front views showing steps of a common method for manufacturing an electronic component;

FIGS. 17A and 17B are sectional views showing other steps of the known method for manufacturing the electronic component.

DETAILED DESCRIPTION OF PREFERRED EMBODIMENTS

Preferred embodiments of the present invention will be described below with reference to FIGS. 1 to 14.

A method for manufacturing an electronic component according to a preferred embodiment of the present invention is suitable for manufacturing a module type surface-mount electronic component in which mounting elements such as IC chips, capacitors, resistors, inductors, and other electronic components and elements, are surface-mounted.

The electronic component is preferably a high-frequency composite module such as a voltage controlled oscillator (VCO), a phase-locked loop (PLL) module, a synthesizer module, a filter, a duplexer, and a radio frequency (RF) power amplifier which is used in a small communication device such as a mobile phone and which is covered with a metal cover which functions as a shield case.

Figure 2A:
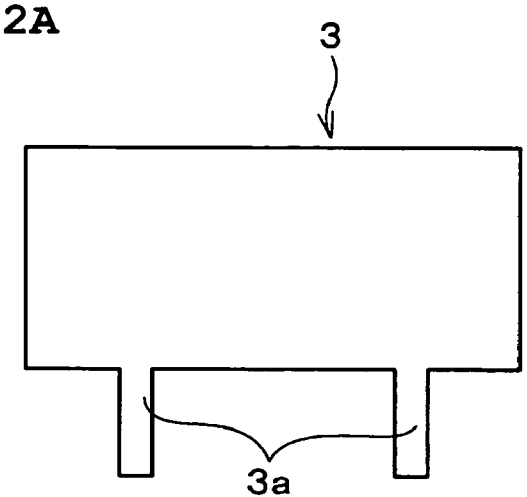
FIGS. 2A to 2C are front views showing the steps of the method for manufacturing the electronic component.
Figure 2B:
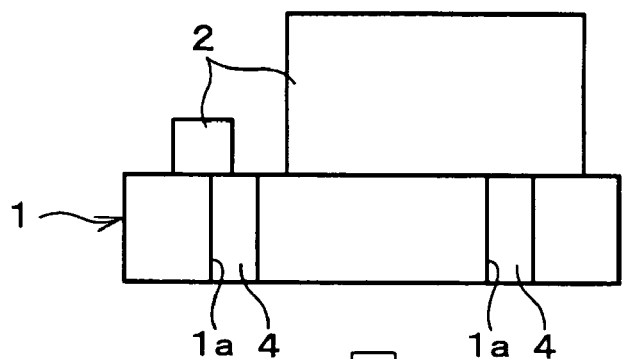
Figure 2C:
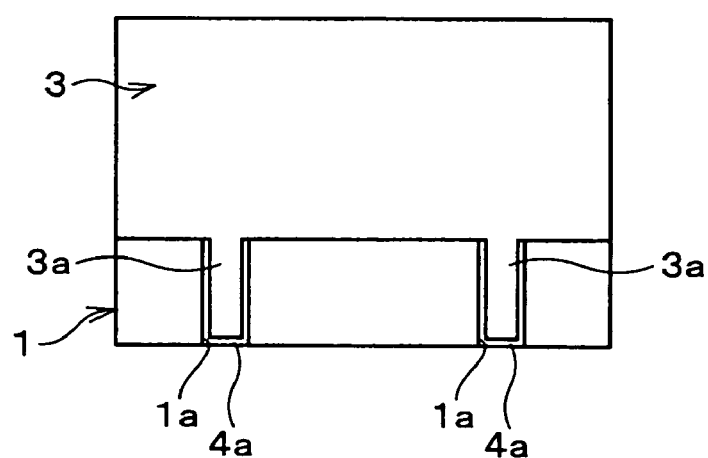

An example of an electronic component is shown in FIGS. 2A to 2C. With reference to FIG. 2B, the electronic component preferably includes a substantially rectangular plate-shaped circuit board 1 and mounting elements 2 which are placed on the front surface of the circuit board 1. The circuit board 1 is preferably composed of an electrically insulative material which has a heat resistance such that the characteristics do not change when it is heated to about 300° C. in a short time such as approximately 2 to 3 minutes, and a glass-epoxy substrate, for example, may be used. In addition, a multilayer substrate having internal electrical circuits may also be used.

Figure 3:
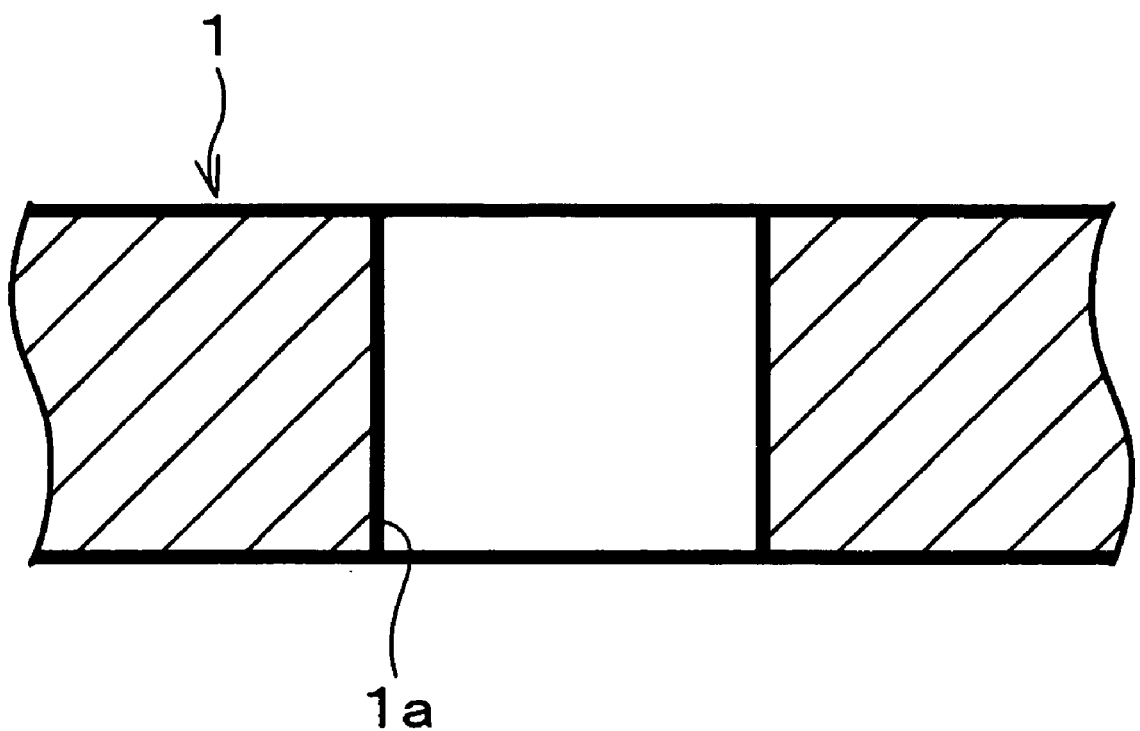
FIG. 3 is a sectional view showing the main portion of a circuit board included in the electronic component.

As shown in FIG. 3, the circuit board 1 has a plurality of through holes 1a which extend through the thickness of the circuit board 1 at the periphery thereof. Since a cutting process is performed as will be described below, the through holes 1a are preferably substantially semicircular in cross section along the direction that is substantially perpendicular to the thickness direction of the circuit board 1.

A conductive material such as a nickel-gold (Ni—Au) alloy which has an affinity for solder, that is, which is adhesive to solder, is preferably plated on the inner surfaces of the through holes 1a.

In the electronic component, a substantially rectangular box-shaped metal cover 3 which functions as a shield case is attached to the circuit board 1 so as to cover the mounting elements 2 and is grounded. The metal cover 3 is preferably made of a material which can block the electromagnetic waves by reflecting or absorbing them, and copper or a copper alloy is preferably used.

The metal cover 3 may also be constructed such that a thin film of, for example, copper or a copper alloy which can block the electromagnetic waves is provided on at least one of the inner surface and the outer surface of a cover main body preferably made of a synthetic resin.

A method of attaching the metal cover 3 will be described below. First, tabs 3a provided on the metal cover 3 are inserted into the through holes 1a formed in the circuit board 1, and solder cream 4 is supplied to the through holes 1a by printing using a print mask. Then, the solder cream (adhesive) 4 is melted by heating and solidified so that solder 4a is obtained. Accordingly, as shown in FIG. 2C, the metal cover 3 is attached to the circuit board 1 so as to cover the mounting elements 2 and the tabs 3a are fixed to their respective through holes 1a by the solder 4a. Therefore, the inner surfaces of the through holes 1a to which the tabs 3a are fixed are preferably conductive and grounded as described above. The solder cream 4 is preferably a fluid including solder particles and volatile solution, and is in a paste form.

Next, the print mask used for supplying the solder cream 4 to the through holes 1a by printing will be described below. In the following descriptions, the case in which a plurality of circuit boards 1 is included in a single wafer is considered. The through holes 1a are formed in each of the circuit boards 1, and the print mask (mask, adhesive supply mask) is used for attaching the metal cover 3 to each of the circuit boards 1 with the solder 4a.

Figure 4:
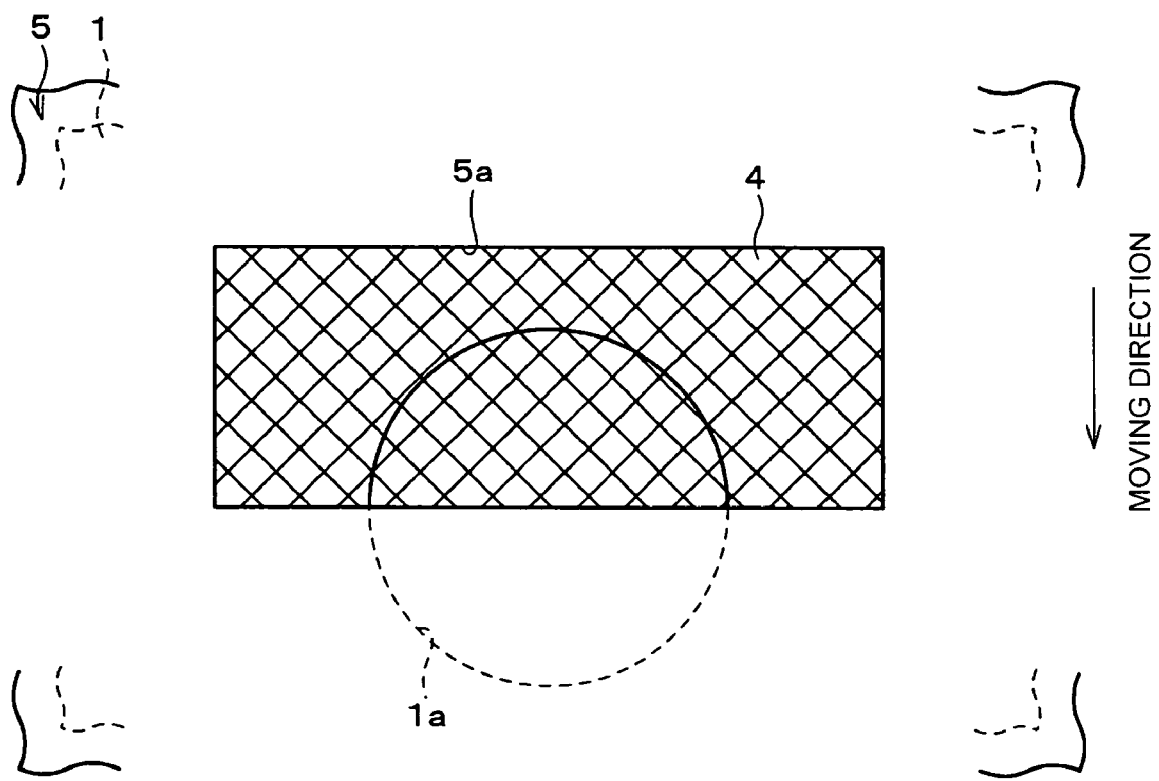
FIG. 4 is a plan view showing one of the steps of the method for manufacturing an electronic component according to a preferred embodiment of the present invention and a modification of the print mask used in the method.

With reference to FIGS. 4 and 5, a print mask 5 is a metal plate having high durability and resistance to corrosion, and is disposed on the back surfaces of the circuit boards 1 having the mounting elements 2 on the front surfaces thereof such that the solder cream 4 can be supplied to the through holes 1a by printing. In addition, the print mask 5 has openings 5a which at least overlap the through holes 1a into which the solder cream 4 is to be provided when the print mask 5 is disposed on the circuit boards 1. The thickness of the print mask 5 is preferably smaller than the diameter of the through holes 1a (that is, the dimension in a moving direction which will be described below).

A process of supplying the solder cream 4 by printing using the print mask 5 will be described below with reference to FIG. 5A. First, the solder cream 4 is placed on the print mask 5, which is disposed on the back surface of the circuit boards 1, at one end thereof. Then, a squeegee 6 is moved from the end of the print mask 5 on which the solder cream 4 is disposed toward the other end while an end portion of the squeegee 6 is in contact with the surface of the print mask 5. Accordingly, the solder cream 4 moves along with the squeegee 6, and a portion of the solder cream 4 is supplied to the through holes 1a through the openings 5a by being pushed by the squeegee 6 when the solder cream 4 passes above the openings 5a.

In the manufacturing method according to various preferred embodiments of the present invention, the openings 5a are designed in accordance with the moving direction of the solder cream 4, as shown in FIGS. 4 and 5. More specifically, the openings 5a are shifted upstream in the moving direction of the solder cream 4 so that the through holes 1a are partially covered with the print mask 5 at the peripheral regions around the openings 5a. Accordingly, the overlapping area between the openings 5a and the through holes 1a can be reduced, that is, adjusted, and the amount of the solder cream 4 supplied to the through holes 1a can thus be adjusted.

In addition, each of the openings 5a is preferably substantially rectangular and has shorter sides which extend along the above-described moving direction and longer sides which extend along the direction that is substantially perpendicular to the above-described moving direction. The length of the shorter sides of the openings 5a is preferably shorter than the dimension of the through holes 1a along the above-described moving direction, and the length of the longer sides of the openings 5a is preferably longer than the dimension of the through holes 1a along the direction that is substantially perpendicular to the above-described moving direction. Accordingly, the solder cream 4 can be supplied to the inner surface of each through hole 1a, in particular, to regions of the inner surface of each through hole 1a on both ends of the through hole 1a with respect to the above-described moving direction.

In addition, the centers of the openings 5a are preferably shifted upstream in the above-described moving direction with respect to the centers of the corresponding through holes 1a along imaginary lines which pass through the centers of the through holes 1a along the above-described moving direction. Accordingly, the solder cream 4 can be equally supplied to the regions of the inner surface of each through hole 1a on both ends of the through hole 1a with respect to the above-described moving direction.

Figure 6:
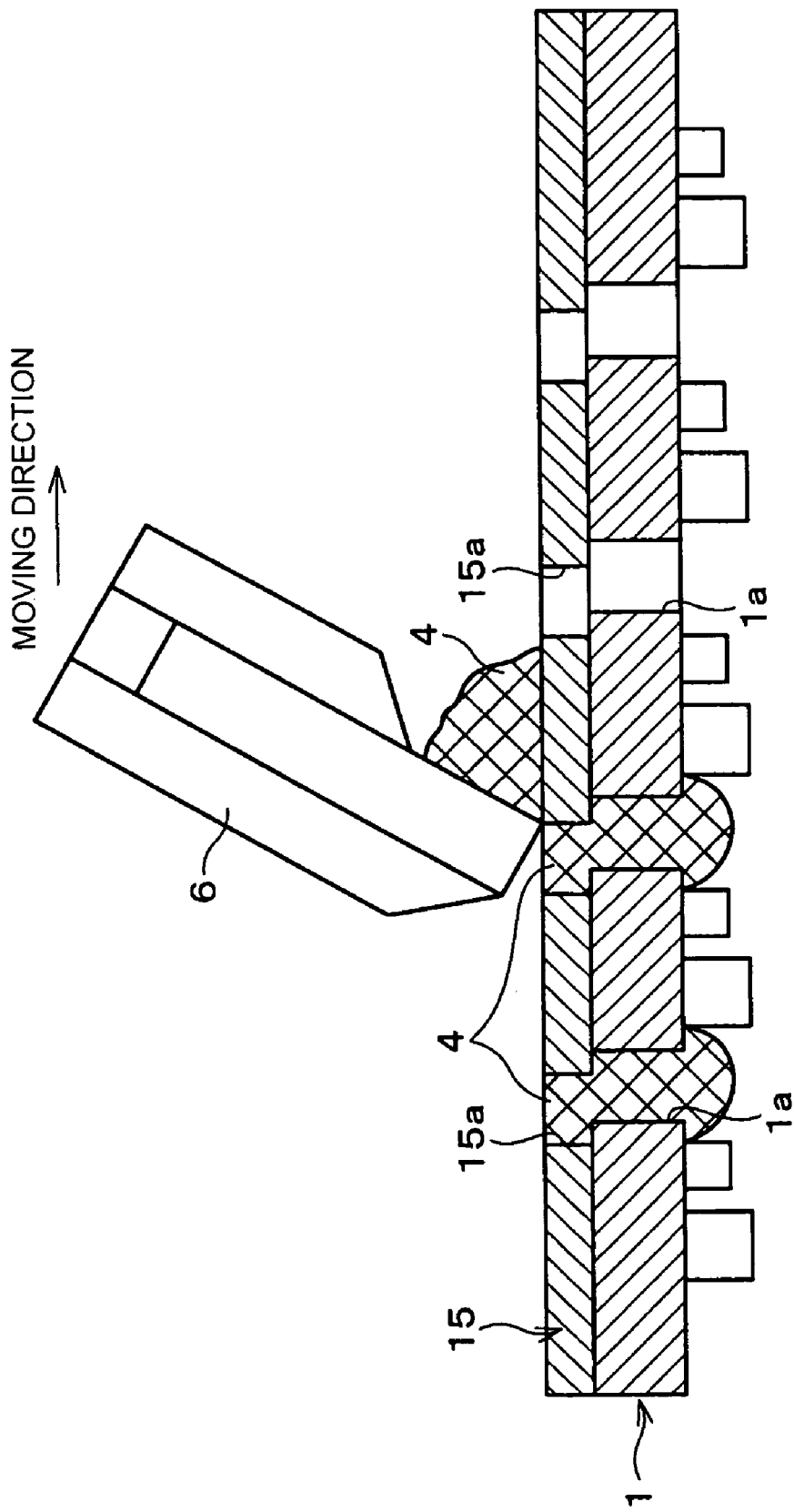
FIG. 6 is a sectional view showing one of the steps of a method for manufacturing an electronic component according to a first comparative example.

FIG. 6 shows a first comparative example in which a print mask 15 having openings 15a whose length is larger than the thickness of the print mask 5 is used. In this case, excessive solder cream 4 is supplied to the through holes 1a and problems similar to those of the known methods occur.

When the print mask 5 according to a preferred embodiment of the present invention is used, the use of excessive solder cream 4 can be prevented and an adequate amount of solder cream 4 can be supplied to each of the through holes 1a, in particular, to regions of the inner surface of each through hole 1a on both ends of the through hole 1a with respect to the above-described moving direction.

Figure 1:
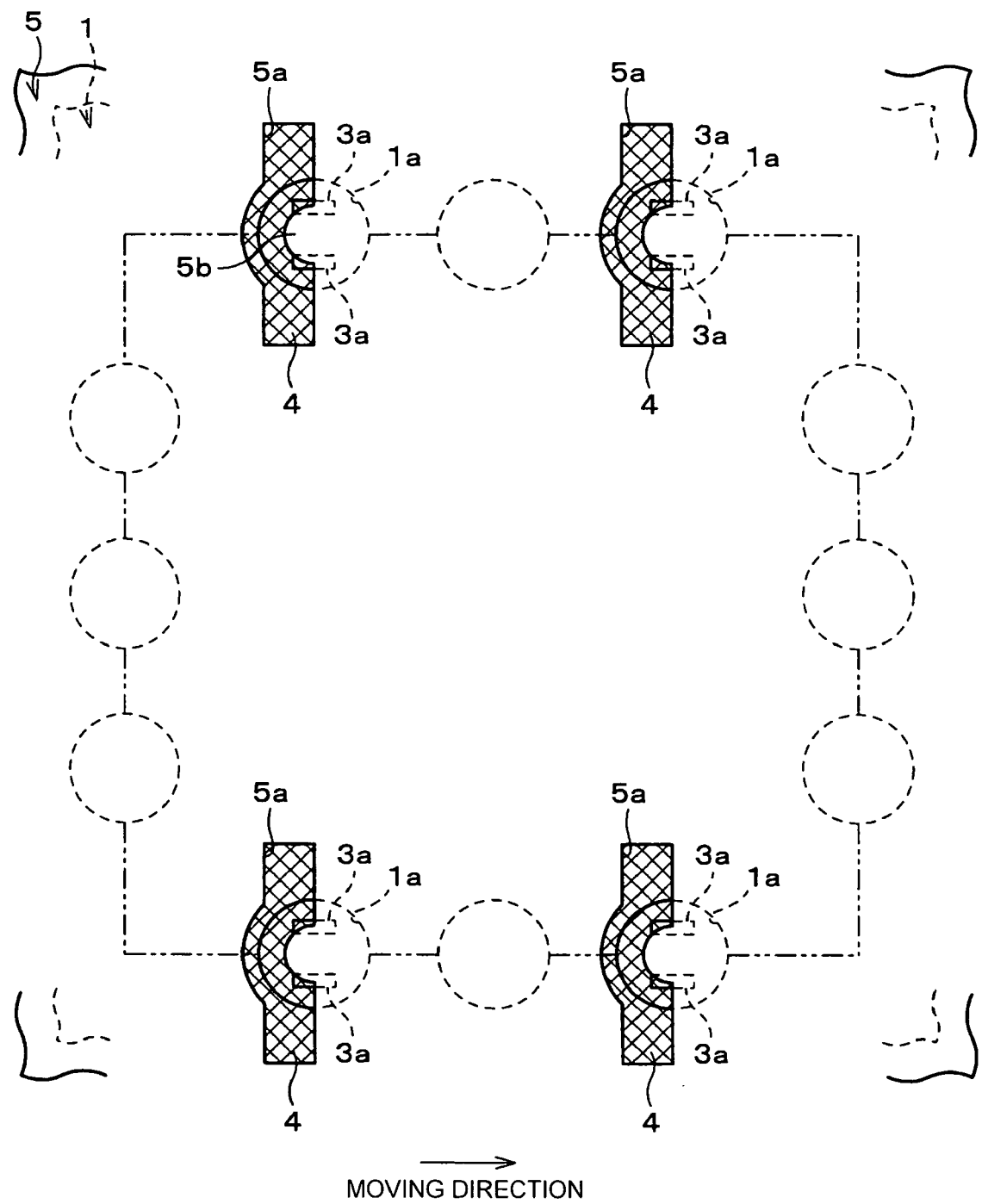
FIG. 1 is a plan view showing one of the steps of a method for manufacturing an electronic component according to a preferred embodiment of the present invention and a print mask used in the method.
Figure 7:
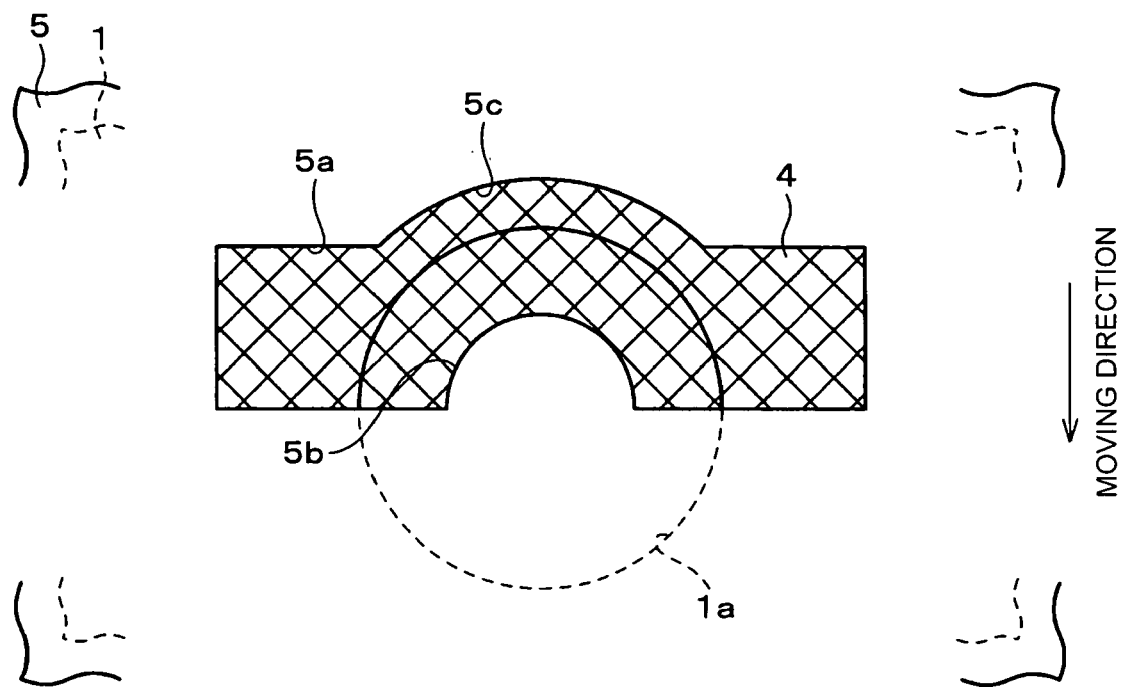
FIG. 7 is an enlarged view showing the step of the method for manufacturing the electronic component shown in FIG. 1 wherein tabs are removed.
Figure 8:
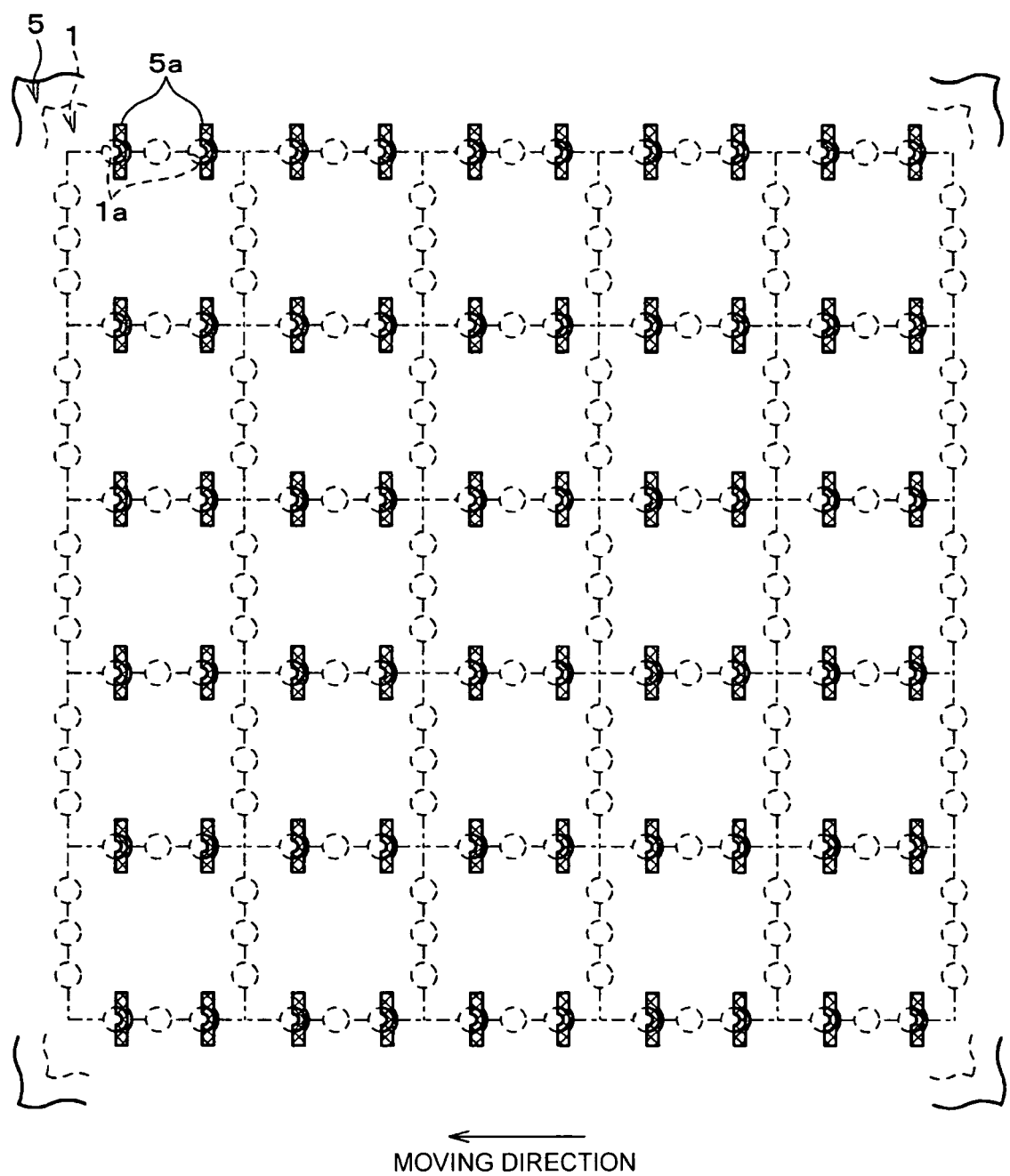
FIG. 8 is an overall plan view showing the step of the method for manufacturing the electronic component shown in FIG. 1 wherein the tabs are removed.
Figure 9:
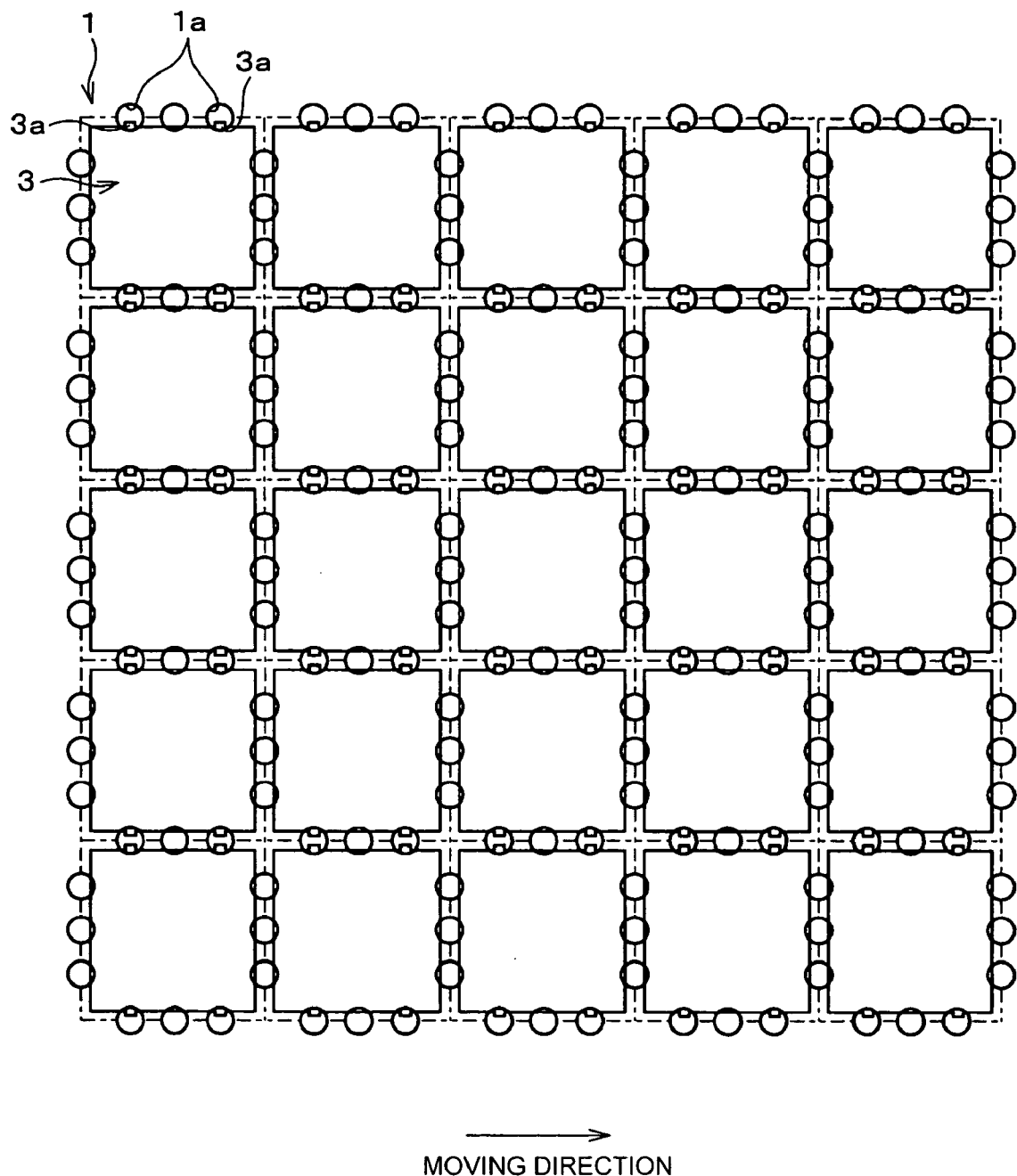
FIG. 9 is an overall plan view seen from the side opposite to FIG. 8 showing the step of the method for manufacturing the electronic component shown in FIG. 1.
Figure 10:
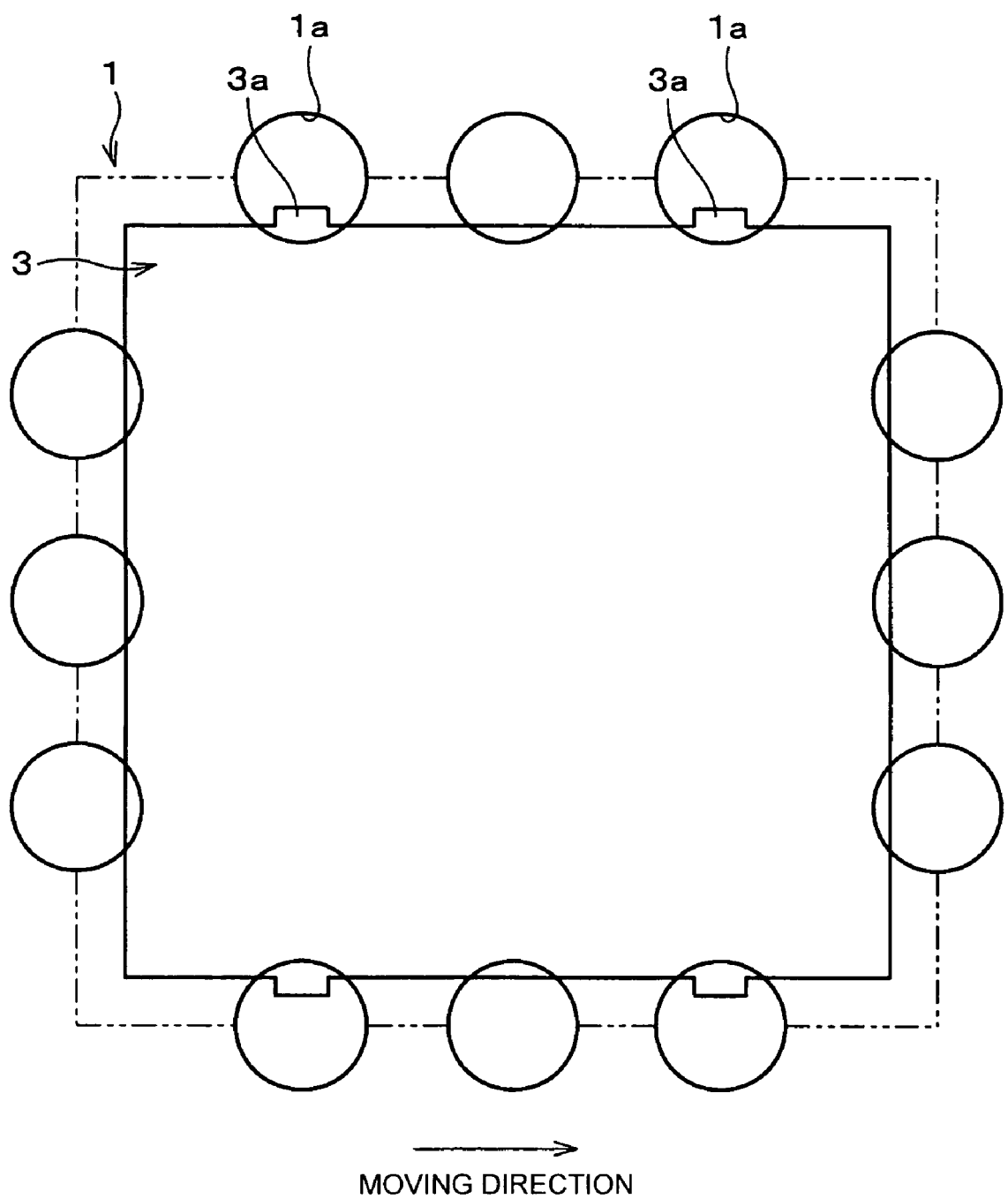
FIG. 10 is an enlarged plan view of a portion of FIG. 9.
Figure 11A:
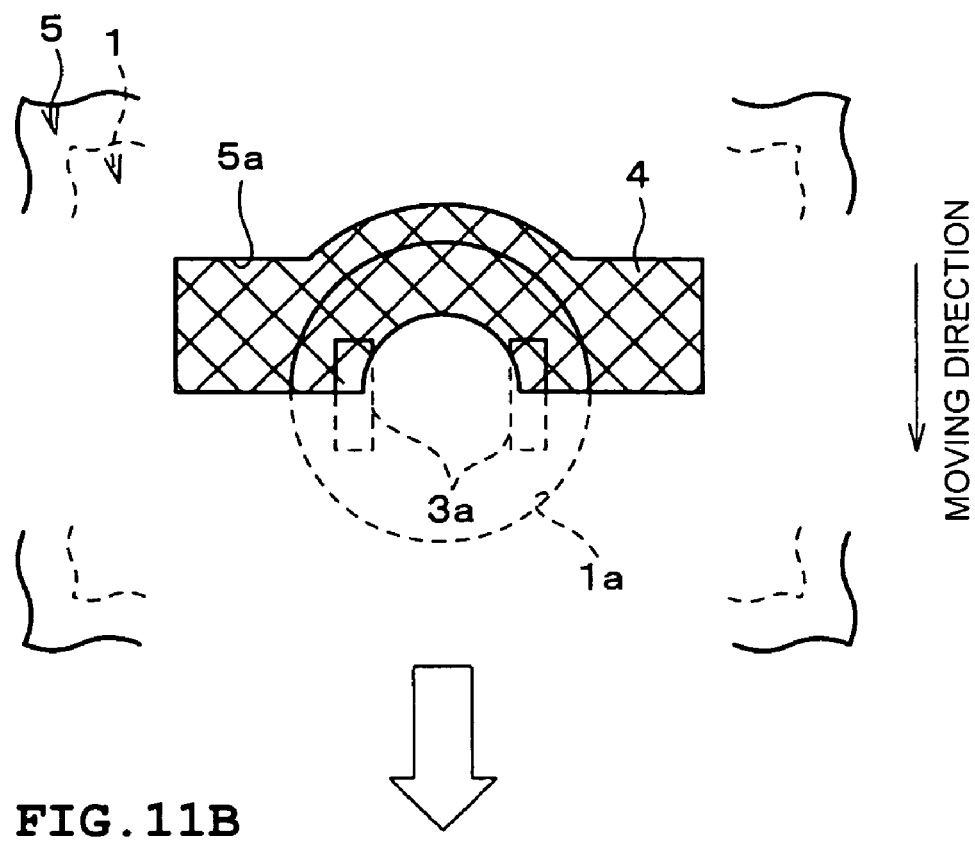
FIGS. 11A and 11B are diagrams showing the steps of the method for manufacturing the electronic component according to a preferred embodiment of the present invention, where

As shown in FIGS. 1, 7, and 11, the mask 5 is preferably provided with projections 5b which project upstream in the above-described moving direction from the downstream sides of the openings 5a in the above-described moving direction. In such a case, preferably, the mask 5 is also provided with arc notches 5c in the upstream sides of the openings 5a in the above-described moving direction such that the cross-sectional area of the openings 5a along the surface of the print mask 5 (that is, the area of the region through which the solder cream 4 is supplied) is the same as that in the case where the projections 5b are not provided.

End portions of the projections 5b are preferably positioned on imaginary lines which pass through the centers of the through holes 1a along the above-described moving direction in which the squeegee 6 moves the solder cream 4. In addition, each of the projections 5b is preferably symmetric with respect to the corresponding imaginary line. In addition, the shape of the projections 5b is preferably similar to the shape of the through holes 1a. For example, the shape of the through holes 1a is preferably substantially circular and the shape of the projections 5b is preferably substantially semicircular.

The above-described imaginary lines also function as cutting lines (dicing lines) along which the electronic components arranged on the surface of the wafer are separated from each other by, for example, dicing.

When the print mask 5 having the projections 5b is used, end portions of the tabs 3a provided on each cover 3 are preferably plate shaped and are inserted into the through holes 1a such that the width direction of the tabs 3a is along the above-described moving direction. More preferably, the width direction of the tabs 3a is substantially parallel to the above-described moving direction.

As described above, in the above-described method, the print mask 5 is provided with the projections 5b which project upstream in the moving direction of the solder cream 4 in the openings 5a of the print mask 5. Accordingly, in each of the through holes 1a, the solder cream 4 can be more reliably separated into the directions toward the regions of the inner surface of the through hole 1a on both ends thereof with respect to the above-described moving direction. In addition, the solder cream 4 can be more efficiently supplied to the gaps between the inner surface of each through hole 1a and the tabs 3a of the metal covers 3 since the tabs 3a are oriented in the above-described manner.

Figure 11B:
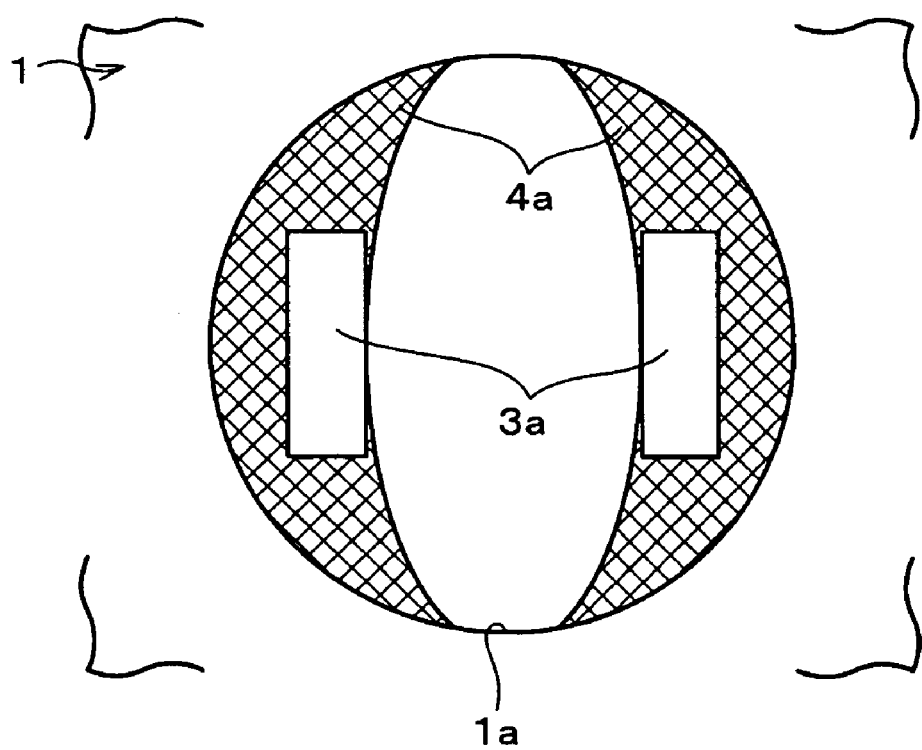

Thus, according to the above-described method, when the tabs 3a are fixed to the circuit board 1 by the solder 4a obtained by melting the solder cream 4 by heating and solidifying it, sufficient amount of solder 4a can be supplied for attaching the tabs 3a to the inner surfaces of the through holes 1a, as shown in FIG. 11B.

Therefore, according to the above-described method, even when the amount of solder cream 4 supplied to the through holes 1a is reduced, the solder 4a can be supplied in an amount that is sufficient to attach the tabs 3a to the inner surfaces of the through holes 1a. Therefore, degradation in the electrical characteristics caused when the solder 4a obtained from the solder cream 4 is in contact with the mounting elements 2 can be prevented. In addition, the adhesion strength can be increased and variation in the state of adhesion can be reduced. As a result, the yield of the electronic component can be increased.

In addition, according to the above-described method, costs can be reduced since the use of excessive solder 4a is prevented. In addition, as shown in FIG. 11B, a hollow space which extends along the above-described moving direction (along the imaginary line) can be provided between the tabs 3a inserted into each of the through holes 1a. Accordingly, the cutting process, such as dicing, along the above-described moving direction can be performed smoothly.

Figure 12A:
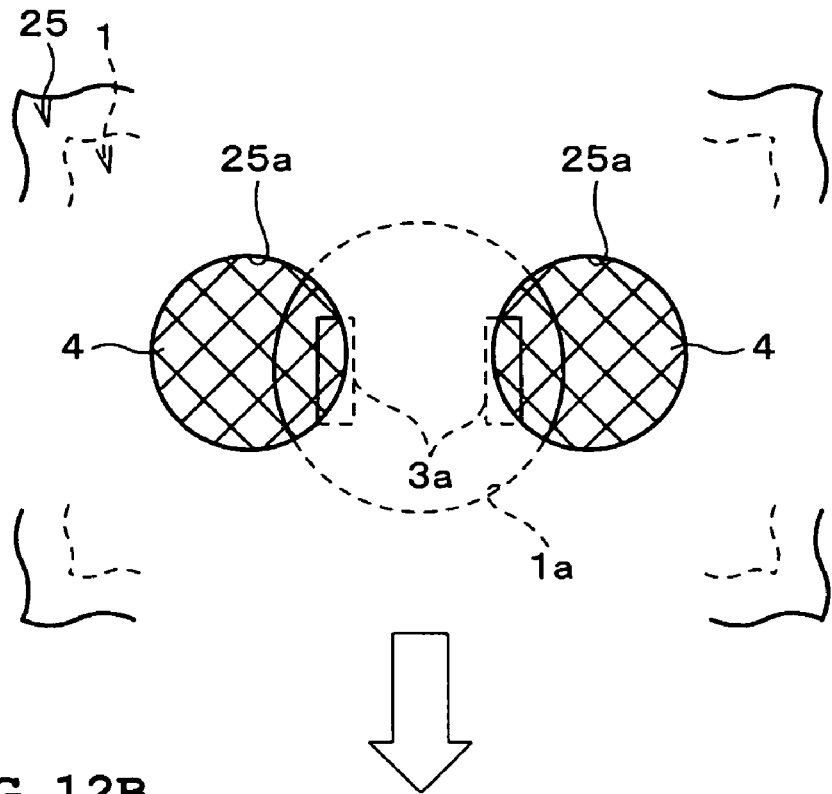
FIGS. 12A and 12B are diagrams showing steps of a method for manufacturing an electronic component according to a second comparative example, where
Figure 12B:
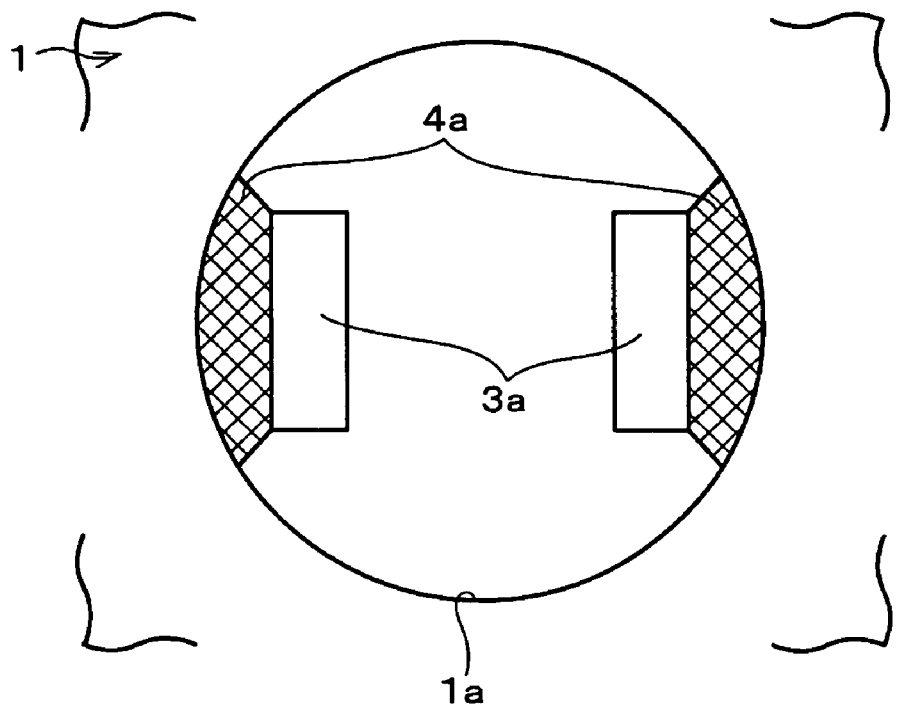

A second comparative example will be described with reference to FIGS. 12A and 12B. With reference to FIG. 12A, a print mask 25 has openings 25a which correspond to the tabs 3a inserted into each through hole 1a so that the solder cream 4 is supplied only to the gaps between the tabs 3a and the inner surface of the through hole 1a. An electronic component of the second comparative example was manufactured by supplying the solder cream 4 to the through holes 1a using this print mask 25 and melting and solidifying the solder cream 4 to obtain the solder 4a, as shown in FIG. 12B. In the electronic component of the second comparative example, the solder 4a was provided only on the back surfaces of the tabs 3a.

Figure 13:
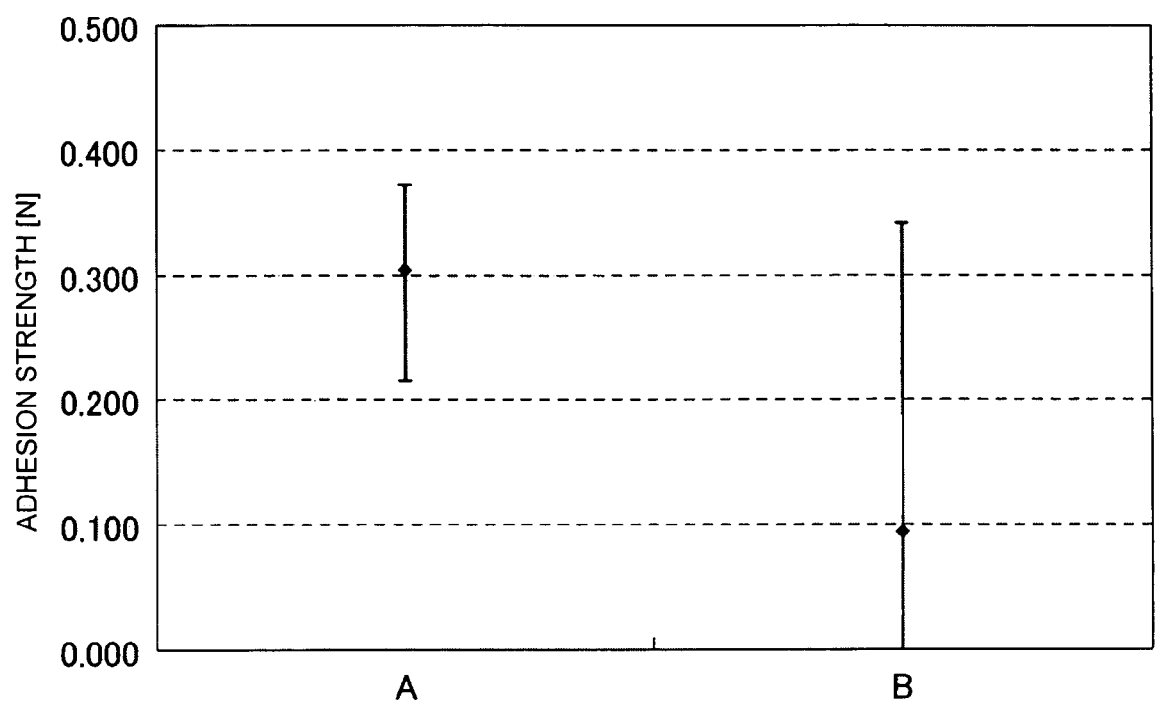
FIG. 13 is a graph showing the adhesive strength of the components manufactured by the method according to a preferred embodiment of the present invention shown in FIGS. 11A and 11B (A) and those manufactured by the method according to the second comparative example shown in FIGS. 12A and 12B (B)

For the purpose of comparison, a plurality of electronic components were manufactured by the method according to various preferred embodiments of the present invention and by the method according to the second comparative example, and the adhesion strength of each of the electronic components was measured. As a result, as shown in FIG. 13, the electronic components manufactured by the method according to preferred embodiments of the present invention (A) had much greater adhesion strength and fewer variations in the adhesion strength compared to the electronic components manufactured by the method according to the second comparative example (B). Therefore, according to the method of various preferred embodiments of the present invention, the metal cover 3 can be more reliably fixed to the through holes 1a.

Thus, in the method for manufacturing the electronic component according to various preferred embodiments of the present invention, the openings 5a of the print mask 5 are shifted upstream and the projections 5b which project upstream are provided in the openings 5a. In addition, the tabs 3a are inserted into the through holes 1a such that the width direction of each tab 3a is along the above-described moving direction of the solder cream 4. Therefore, the adhesion strength can be increased and variations in the adhesion strength can be reduced. Accordingly, the metal cover 3 can be reliably fixed to the through holes 1a by adhesion. In addition, the use of excessive solder 4a can be prevented and degradation in the electrical characteristics of the mounting elements 2 due to the excess solder 4a does not occur. Accordingly, the yield of the electronic components can be increased.

Figure 14:
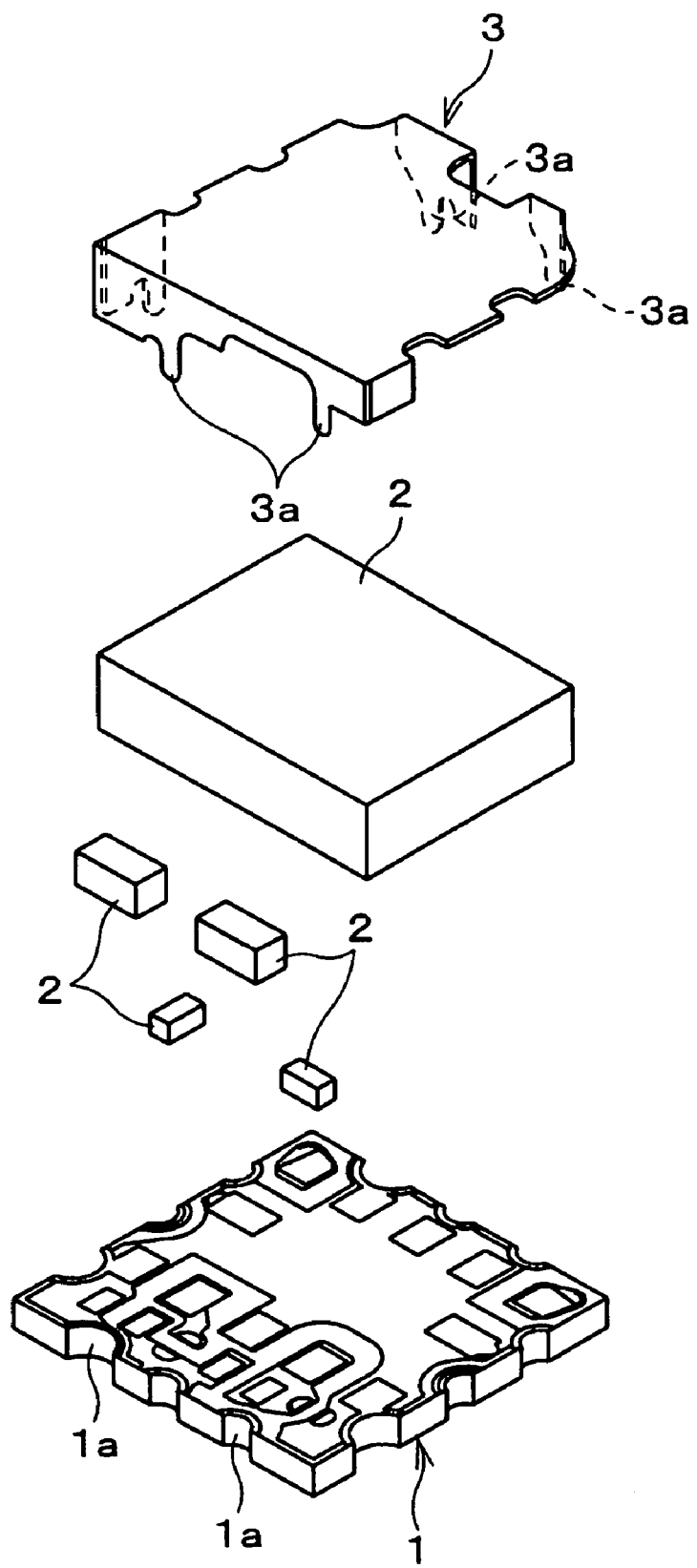
FIG. 14 is a perspective view showing another example of an electronic component manufactured by the method of manufacturing the electronic component according to a preferred embodiment of the present invention.
Figure 16:
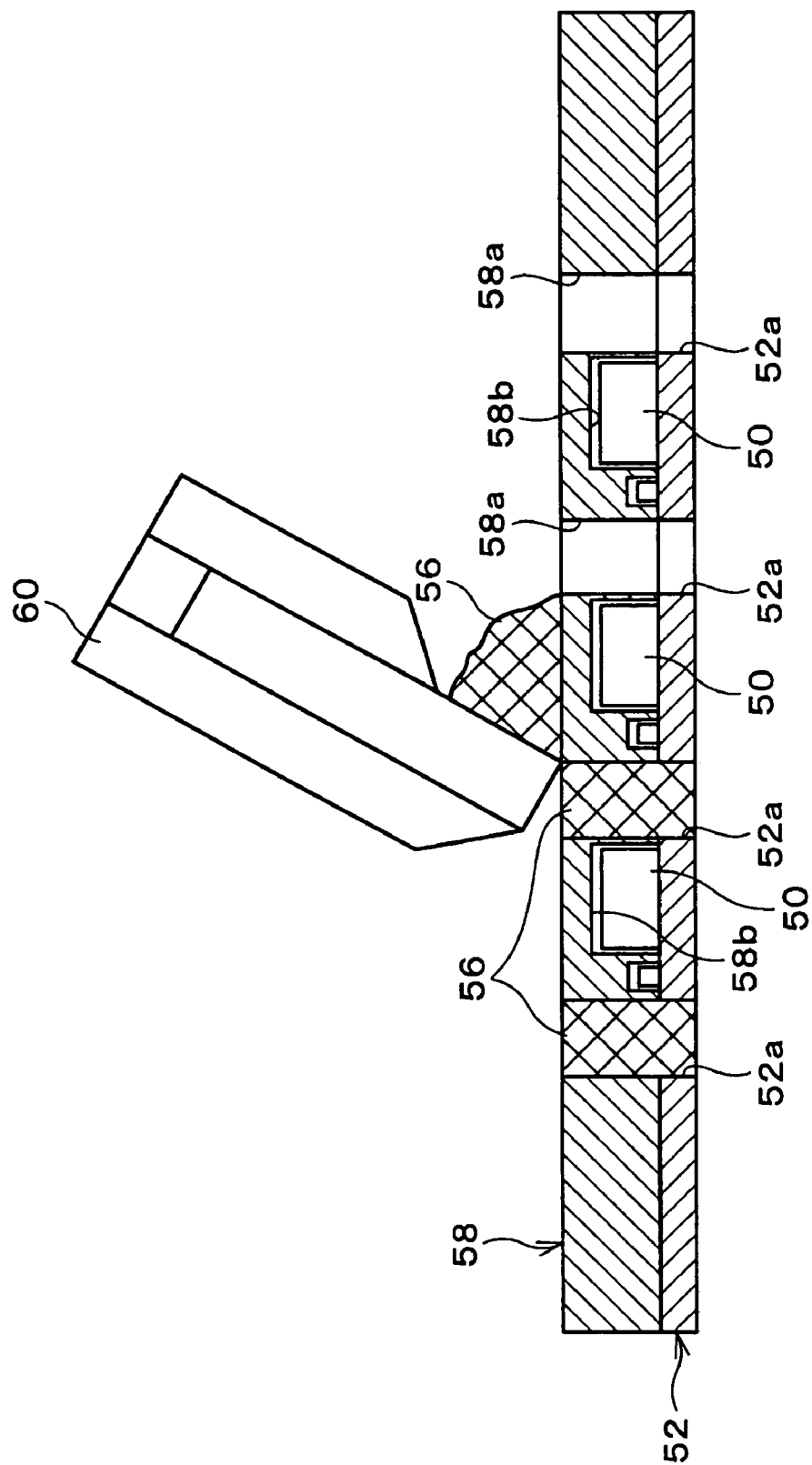
FIG. 16 is a sectional view showing a step of a known method for manufacturing an electronic component.

FIG. 14 shows a duplexer as another example of an electronic component in which two surface acoustic wave filters having different passband widths are used as the mounting elements 2. Although the case in which the metal cover 3 is used as a shield case is described above, the present invention can also be applied to the case in which the shield case is not necessary. For example, the present invention may also be applied to the case in which a liquid synthetic resin adhesive such as heat-curing resin or other suitable material is used in place of the solder cream 4. Also in this case, the amount of synthetic resin adhesive supplied and the regions to which it is supplied can be controlled and adjusted and the problems which occur when heat is transmitted from the synthetic resin adhesive to the mounting elements can be prevented. Accordingly, it is clear that the effects of preferred embodiments of the present invention can also be obtained in this case.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A method for manufacturing an electronic component comprising the steps of:

forming through holes in a circuit board having mounting elements on a front surface of the circuit board;

inserting tabs of a cover into the through holes;

disposing a mask on a back surface of the circuit board, the mask having openings for supplying a fluid adhesive to the through holes by printing at positions corresponding to the through holes;

supplying the adhesive to the through holes by placing the adhesive on the mask and moving the adhesive in a predetermined direction with a squeegee; and solidifying the adhesive to fix the cover to the circuit board; wherein the mask is provided with projections in the openings thereof, the projections projecting upstream in a moving direction in which the squeegee moves the adhesive, the through holes are partially covered with the mask, and the tabs of the cover are inserted into the through holes such that the width direction of the tabs extends along the moving direction in which the squeegee moves the adhesive.

2. A method for manufacturing the electronic component according to claim 1, wherein a single through hole receives at least two of the tabs, and end portions of the projections are positioned on imaginary lines which pass through centers of the through holes along the moving direction in which the squeegee moves the adhesive.

3. A method for manufacturing the electronic component according to claim 1, wherein end portions of the projections are positioned on imaginary lines which pass through the centers of the through holes along the moving direction in which the squeegee moves the adhesive, and wherein each of the projections is symmetric with respect to the corresponding imaginary line.

4. A method for manufacturing the electronic component according to claim 1, wherein the shape of the projections is similar to the shape of the through holes.

5. A method for manufacturing the electronic component according to claim 1, wherein the adhesive is a solder material.

6. A method for manufacturing the electronic component according to claim 1, wherein the mounting elements include at least one of an IC chip, a capacitor, a resistor, and an inductor.

7. A method for manufacturing the electronic component according to claim 1, wherein the electronic component is one of a voltage controlled oscillator, a phase-locked loop module, a synthesizer module, a filter, a duplexer, and a radio frequency power amplifier.

8. A method for manufacturing the electronic component according to claim 1, further comprising the step of plating a conductive material on inner surfaces of the through holes.

9. A method for manufacturing the electronic component according to claim 1, wherein the cover is a metal cover which defines a shield case.

10. A method for manufacturing the electronic component according to claim 1, wherein the adhesive is a solder cream.

11. A method for manufacturing the electronic component according to claim 1, wherein the mask is provided with arc notches in the upstream sides of the openings in the moving direction.

12. A method for manufacturing the electronic component according to claim 1, wherein the electronic component is a duplexer.

13. A method for manufacturing the electronic component according to claim 12, wherein the mounting elements include surface acoustic wave filters.

* * * * *